(12) United States Patent
Matz et al.

(10) Patent No.: US 7,727,885 B2
(45) Date of Patent: Jun. 1, 2010

(54) REDUCTION OF PUNCH-THRU DEFECTS IN DAMASCENE PROCESSING

(75) Inventors: Phillip Daniel Matz, Murphy, TX (US); Sopa Chevacharoenkul, Richardson, TX (US); Ching-Te Lin, Plano, TX (US); Basab Chatterjee, Allen, TX (US); Anand Reddy, Dallas, TX (US); Kenneth Joseph Newton, McKinney, TX (US); Ju-Ai Ruan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 11/511,698

(22) Filed: Aug. 29, 2006

(65) Prior Publication Data

US 2008/0057711 A1    Mar. 6, 2008

(51) Int. Cl.
*H01L 21/44* (2006.01)
(52) U.S. Cl. ............... 438/634; 438/653; 438/799; 438/678; 257/E21.586; 257/E21.579; 257/E21.584
(58) Field of Classification Search ........ 438/740, 438/799, 634, 653, 678; 257/E21.585, E21.586, 257/E21.575, E21.479, E21.161, E21.171, 257/E21.174, E21.175, E21.584, E21.579
See application file for complete search history.

(56) References Cited

U.S. PATENT DOCUMENTS

| | | | |
|---|---|---|---|
| 5,698,071 A | 12/1997 | Kawamoto | |
| 6,455,939 B1 | 9/2002 | Raina et al. | |
| 7,045,455 B2 | 5/2006 | Zhang et al. | |
| 2003/0017696 A1* | 1/2003 | Yen | 438/672 |
| 2004/0161930 A1* | 8/2004 | Ma et al. | 438/689 |
| 2004/0214430 A1* | 10/2004 | Ruelke et al. | 438/687 |
| 2005/0023693 A1* | 2/2005 | Fitzsimmons et al. | 257/758 |
| 2005/0032354 A1* | 2/2005 | Chu et al. | 438/636 |
| 2005/0042889 A1* | 2/2005 | Lee et al. | 438/780 |
| 2005/0067297 A1* | 3/2005 | Tench et al. | 205/296 |
| 2005/0106370 A1* | 5/2005 | Takai et al. | 428/209 |
| 2005/0245071 A1* | 11/2005 | Wu et al. | 438/627 |
| 2006/0040487 A1* | 2/2006 | Inoue et al. | 438/597 |
| 2006/0084260 A1* | 4/2006 | Boyers et al. | 438/618 |
| 2006/0118962 A1* | 6/2006 | Huang et al. | 257/760 |
| 2006/0170106 A1* | 8/2006 | Tseng et al. | 257/760 |
| 2006/0172525 A1* | 8/2006 | Werner et al. | 438/624 |

* cited by examiner

*Primary Examiner*—Caridad M Everhart
(74) *Attorney, Agent, or Firm*—Warren L. Franz; Wade J. Brady, III; Frederick J. Telecky, Jr.

(57) ABSTRACT

A semiconductor device is fabricated while mitigating conductive void formation in metallization layers. A substrate is provided. A first dielectric layer is formed over the substrate. A conductive trench is formed within the first dielectric layer. An etch stop layer is formed over the first dielectric layer. A second dielectric layer is formed over/on the etch stop layer. A resist mask is formed over the device and via openings are etched in the second dielectric layer. The resist mask is removed by an ash process. A clean process is performed that mitigates/reduces surface charge on exposed portions of the etch stop layer. Additional surface charge reduction techniques are employed. The via openings are filled with a conductive material and a planarization process is performed to remove excess fill material.

23 Claims, 3 Drawing Sheets

REDUCTION OF PUNCH-THRU DEFECTS IN DAMASCENE PROCESSING

FIELD OF THE INVENTION

The present invention relates generally to semiconductor fabrication and, more particularly, to devices and methods that mitigate the occurrence of punch-thru defects in dual or single damascene processing.

BACKGROUND OF THE INVENTION

Integrated circuits and semiconductor devices are fabricated by performing a number of fabrication processes that form various components and regions, such as source/drain regions, gate structures, isolation regions, and the like. One set of structures formed and/or present in semiconductor devices are metallization layers, which provide electrical connections between various components within the devices and external connections.

The metallization layers typically comprise trenches and vias formed in single or dual damascene fabrication processes. The trenches and vias are comprised of conductive materials and are separated by insulating layers comprised of dielectric material to, for example, mitigate crosstalk between various layers. The trenches and vias form interconnects or pathways through the dielectric material.

The yield and reliability of fabricated semiconductor devices is dependent upon the single or dual damascene fabrication processes employed to form the metallization layers. Defects in the metallization layers can be formed or introduced during the damascene fabrication processes and degrade the overall yield and reliability of semiconductor devices.

One type of defect that can be found in metallization layers is a punch thru defect, which is a region of missing copper in a metal level that is undesirably removed. The punch thru defects can degrade device performance by, for example, increasing resistance or preventing electrical connections.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate formation of metallization layers by mitigating the occurrence of conductive voids, also referred to as punch thru defects. This occurrence is reduced by modifying or adding processes during damascene processing. The modified or added processes can decrease hillock density or formation, decrease diffusion by increasing thickness or remaining dielectric/etch stop layers over conductive material, and/or decrease charge accumulation prior to a wash or clean operation.

A semiconductor device is fabricated while mitigating conductive void formation in metallization layers. A semiconductor substrate is provided. A first dielectric layer is formed over/on the substrate. A conductive trench is formed within the first dielectric layer. An etch stop layer is formed over the first dielectric layer. A second dielectric layer is formed over/on the etch stop layer. A resist mask is formed over the device and via openings are etched in the second dielectric layer. The resist mask is removed by an ash process. A clean process is performed that mitigates/reduces surface charge on exposed portions of the etch stop layer. Additional surface charge reduction techniques are employed. The via openings are filled with a conductive material and a planarization process is performed to remove excess fill material. Other devices and methods of fabrication are disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Aspects of the present invention facilitate formation of metallization layers of semiconductor devices by mitigating the occurrence of conductive voids, also referred to as punch thru defects. This occurrence is reduced by modifying, tailoring, and/or adding processes during damascene processing. The modified or added processes can decrease hillock density or formation, decrease diffusion through dielectric/etch stop layers over conductive material, and/or decrease charge accumulation prior to a wash or clean operation.

Figure 1A:
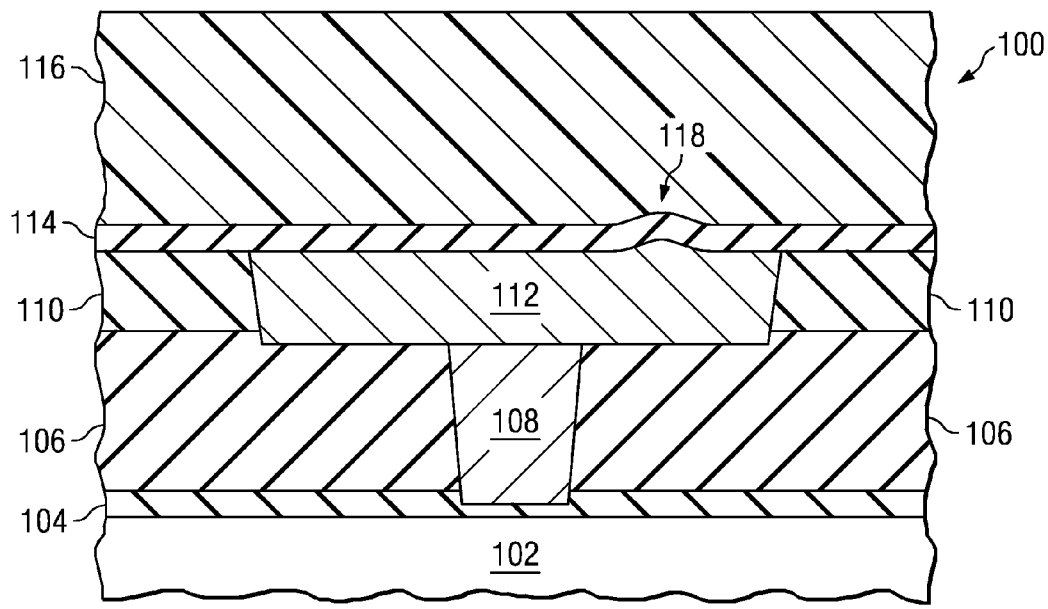
FIG. 1A is a cross sectional view of metallization layers of a semiconductor device.
Figure 1B:
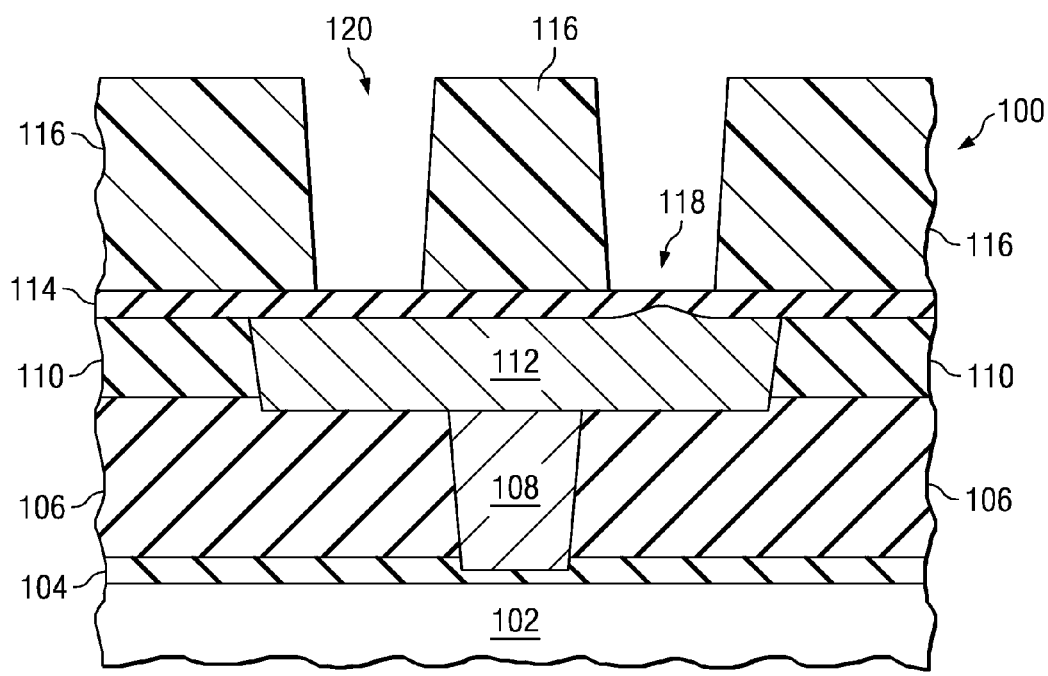
FIG. 1B is another cross sectional view of metallization layers of a semiconductor device.
Figure 1C:
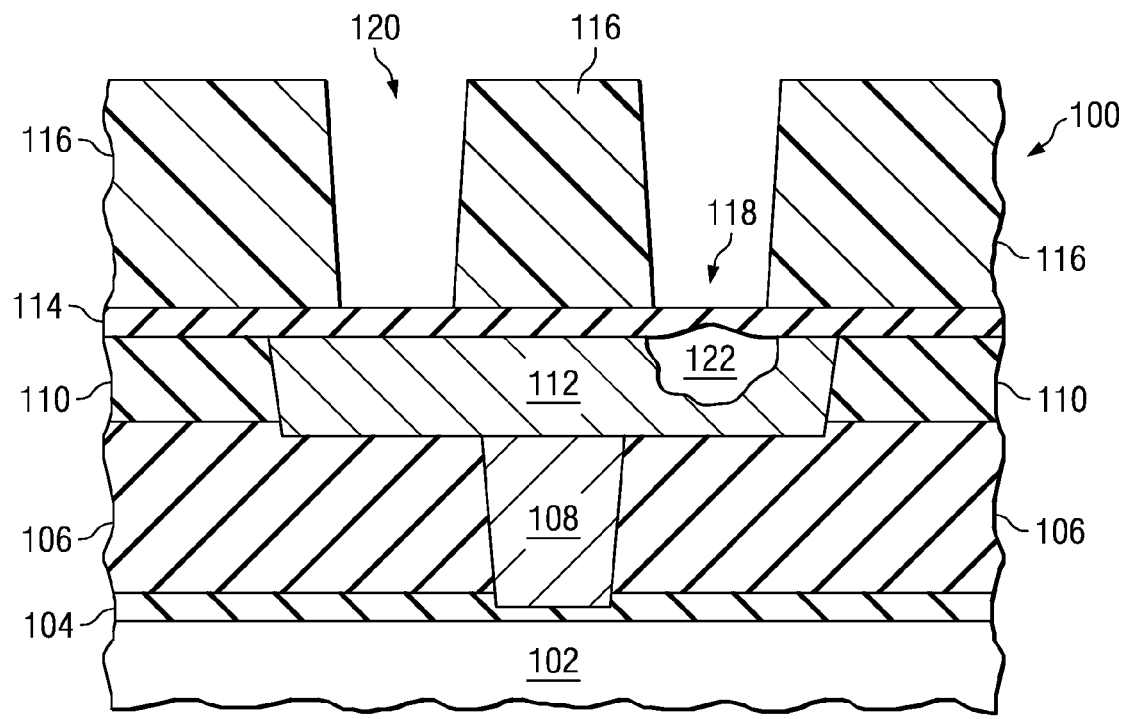
FIG. 1C is yet another cross sectional view of metallization layers of a semiconductor device.

FIGS. 1A to 1C are provided to illustrate an example of copper void defect formation. The views are provided as an example and not to limit the present invention.

FIG. 1A is a cross sectional view of metallization layers of a semiconductor device 100. The device 100 is partially formed and at a stage of fabrication. Some layers may be omitted in this description in order for illustrative purposes.

The device 100 includes a semiconductor substrate 102, comprised of a semiconductor material, such as silicon, germanium, and the like. The substrate 102 can comprise active and/or passive devices formed therein. A first dielectric layer or barrier layer 104 is formed over the substrate 102. A second dielectric layer 106 is formed over the first dielectric layer 104. In one example, the second dielectric layer 108 is comprised dielectric materials, including low-k dielectric materials, borophosphosilicate (BPSPG) glass, Tetraethyl Orthosilicate, $Si(OC_2H_5)_4$ (TEOS), and the like.

A via 108 is formed within the second dielectric layer 106. In one example, an opening is formed within the second dielectric layer 106. A conductive fill process fills the opening with a suitable material, such as copper, a copper alloy, tungsten (W), aluminum, and the like. A planarization process removes excess conductive material and forms the conductive via 108.

A third dielectric layer 110 is formed over the second dielectric layer 106. The third dielectric layer 110 is comprised of a suitable dielectric material, such as low-k dielectric materials, borophosphosilicate (BPSPG) glass, Tetraethyl Orthosilicate, $Si(OC_2H_5)_4$ (TEOS), and the like. A trench 112 is formed within the third dielectric layer 110. The trench 112 is comprised of a conductive material, such as copper, a copper alloy, tungsten (W), aluminum, and the like. The trench 112 can be formed by etching an opening within the third dielectric layer 110, overfilling the opening with a conductive material, and removing excess fill material.

An etch stop layer 114 is formed over the third dielectric layer 110. The etch stop layer 114 is comprised of a dielectric material that has a selected etch rate so as to facilitate subsequent etching of openings in overlying layers. Additionally, the etch stop layer 114 is typically relatively thin to facilitate device performance.

A fourth dielectric layer 116 is formed over the etch stop layer 114. The fourth dielectric layer 116 is comprised of a suitable dielectric material, such as those described above for the third dielectric layer 110.

A hillock region 118 is shown formed on the trench 112. The hillock region 118 can result from a variety of process conditions, such as thermal processes, grain size variations, and the like. The hillock region 118 is formed at a stage after planarizing the trench 112 to remove excess fill material and is a bump or oversized portion of the trench 112. The hillock region 118 also induces a similarly shaped bump in the etch stop region 114.

FIG. 1B is another cross sectional view of metallization layers of a semiconductor device 100. A via etch or patterning operation is performed that forms openings 120 within the fourth dielectric layer 116. A resist mask or other suitable mask is generally employed to form the openings 120. The etch process employed is selective to the dielectric material comprising the fourth dielectric layer 116. The etch stop layer 114 has a lower etch rate than the fourth dielectric layer 116 with regard to the etch process. As a result, the etch stop layer 114 can mitigate etch rate variations across a wafer or device, thus providing more uniform via openings 120. Additionally, the etch stop layer 114 mitigates over etching, such as over etching into the trench 112, which can degrade device performance.

In this example, one of the via openings occurs over the hillock region 118. Because of this, the via etch has removed more of the etch stop layer 114 proximate to the hillock region 118. As a result, the etch stop layer 114 proximate to the hillock region 118 is thinner than desired and thinner than other portions of the etch stop layer 114.

Subsequent to the via etch, the resist mask (not shown) is removed by an ash process, such as an oxygen ash.

Turning now to FIG. 1C, yet another cross sectional view of a semiconductor device 100 is shown. This view is also provided as an example and is illustrated subsequent to a clean process.

After forming the via openings 120 and mask removal, the clean process is performed that removes remaining residue. The clean process can employ a solvent and/or de-ionized water. During the clean process, copper material diffuses through the relatively thin portion of the etch stop layer 114 proximate the hillock region 118 toward a portion of the via openings 120. The relatively thin portion is not sufficiently thick to prevent or suitably mitigate the copper diffusion. Once diffused, the copper is removed from the upper surface of the etch stop layer 114. It may be that the copper oxidizes and dissolves in the cleaning solvent and/or de-ionized water and is there after washed away. However, other mechanisms may be responsible for removing the copper.

As a result, a copper void 122 is formed within the trench 112. The copper void 122 can degrade performance of the device 100 or even result in device failure. The copper void 122 is also referred to as a punch thru defect.

Figure 2:
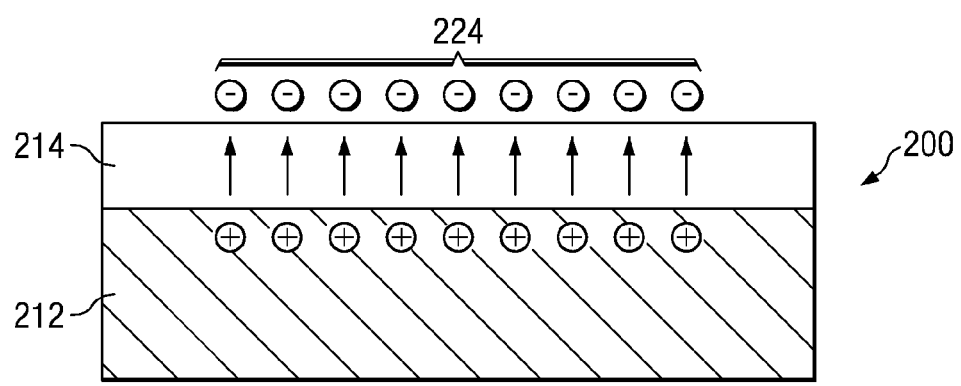
FIG. 2 is a cross sectional view of a portion of a semiconductor device illustrating charge build up and resulting diffusion of conductive materials through an etch stop layer.

FIG. 2 is a cross sectional view of a portion of a semiconductor device 200 illustrating charge build up that encourages diffusion. The view shown is a portion of the device 200 depicting a bottom of a via opening 224, a portion of an etch stop layer 214, and an upper portion of a copper trench 212 after forming the via openings.

The etch stop layer 214 is located on the trench 212. In this example, a surface charge builds on an upper surface of the etch stop layer 214 during the via opening etch. Oppositely charged copper ions within the trench 212 are attracted towards the surface charge. Once the surface charge becomes high enough, the oppositely charged copper ions begin diffusing through the etch stop layer 214. As a result, a copper void or punch thru defect results. FIG. 2 depicts the surface charge as being negative, for illustrative purposes only.

Generally, the inventors of the present invention recognize that the amount of surface charge and the thickness of the etch stop layer 214 are factors that can encourage or discourage the unwanted copper diffusion. For example, thicker etch stop layers and/or lower surface charge mitigate copper void formation whereas thinner etch stop layers and/or higher surface charge increase copper void formation.

Figure 3:
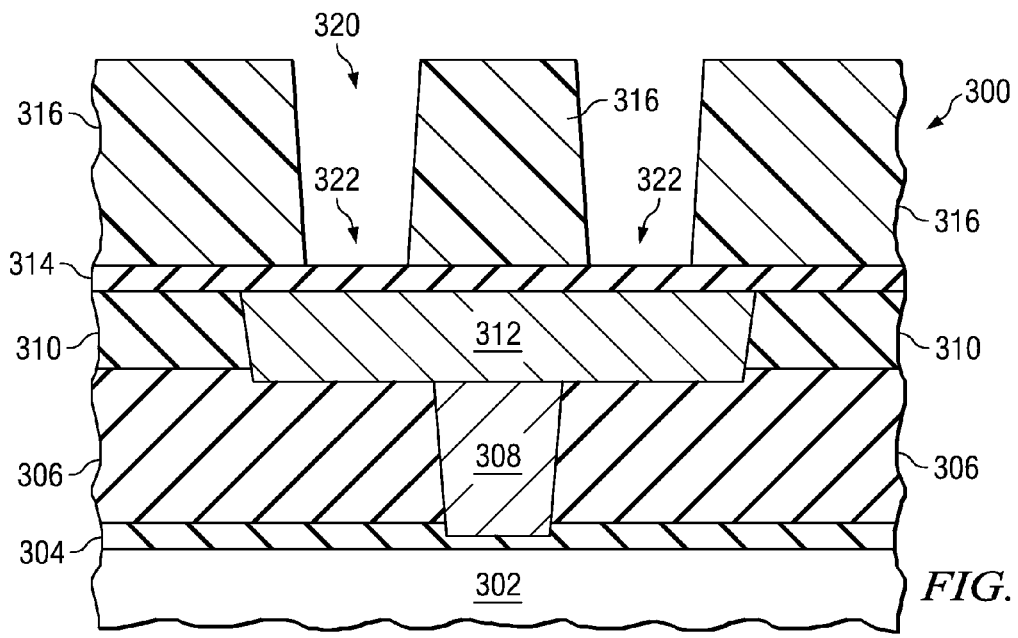
FIG. 3 is a cross sectional view of metallization layers of a semiconductor device in accordance with an aspect of the present invention.

FIG. 3 is a cross sectional view of metallization layers of a semiconductor device 300 in accordance with an aspect of the present invention. The device 300 is partially formed and at a stage of fabrication and is provided as an example. Some layers may be omitted in this description in order for illustrative purposes.

The device 300 is similar to the device 100 of FIGS. 1A to 1C, however the device 300 is fabricated with one or more techniques that mitigate hillock formation, increase thickness of an etch stop layer 314, and/or mitigate surface charge accumulation. Additional description and details of the techniques employed are provided below is subsequent figures.

The device 300 includes a semiconductor substrate 302, comprised of a semiconductor material, such as silicon, germanium, and the like. The substrate 302 can comprise active and/or passive devices formed therein. A first dielectric layer or barrier layer 304 is formed over the substrate 302. In one example, the first dielectric layer 304 is comprised of silicon dioxide.

A second dielectric layer 306 is formed over the first dielectric layer 304. In one example, the second dielectric layer 308 is comprised dielectric materials, including low-k dielectric materials, borophosphosilicate (BPSPG) glass, Tetraethyl Orthosilicate, $Si(OC_2H_5)_4$ (TEOS), and the like. The second dielectric layer 306 can be an interlevel dielectric layer (ILD).

A conductive via 308 is formed within the second dielectric layer 306. In one example, an opening is formed within the second dielectric layer 306. A conductive fill process fills the opening with a suitable material, such as copper, a copper alloy, tungsten (W), aluminum, and the like. A planarization process removes excess conductive material and forms the conductive via 308. Although not shown, an etch stop layer can be formed on the second dielectric layer 306 to facilitate subsequent etching/patterning processes.

A third dielectric layer 310 is formed over the second dielectric layer 306. The third dielectric layer 310 is also comprised of a suitable dielectric material, such as low-k dielectric materials, borophosphosilicate (BPSPG) glass, Tetraethyl Orthosilicate, $Si(OC_2H_5)_4$ (TEOS), and the like. A trench 312 is formed within the third dielectric layer 310. The trench 312 is comprised of a conductive material, such as copper, a copper alloy, tungsten (W), aluminum, and the like. The trench 312 can be formed by etching an opening within the third dielectric layer 310, overfilling the opening with a conductive material, and removing excess fill material.

In an alternate aspect of the invention, the second dielectric layer 306 and the third dielectric layer 310 are formed as a single layer as part of a dual damascene formation process.

An etch stop layer 314 is formed over the third dielectric layer 310. The etch stop layer 314 is comprised of a dielectric material that has a selected etch rate so as to facilitate subsequent etching of openings in overlying layers. Additionally, the etch stop layer 314 is typically relatively thin to facilitate device performance. The dielectric constant of the etch stop layer 314 can be selected and tailored for desired device properties. Additionally, the thickness of the etch stop layer 314 is generally selected so as to mitigate or prevent migration of conductive material from the trench 312 there through.

A fourth dielectric layer 316 is formed over the etch stop layer 314. The fourth dielectric layer 316 is comprised of a suitable dielectric material, such as those described above for the third dielectric layer 310. In one example, the fourth dielectric layer 316 is comprised of a low-k dielectric material. In another example, the fourth dielectric layer 316 is an inter metal dielectric layer (IMD).

Hillock regions are not present because fabrication techniques have been employed to mitigate their formation. For example, a lower temperature may have been employed in forming the etch stop layer 314. As another example, a higher electrochemical deposition annealing temperature can be employed to mitigate hillock formation.

A via etch or patterning operation is performed that forms openings 320 within the fourth dielectric layer 316. A resist mask (not shown) or other suitable mask is generally employed to form the openings 320. The etch process employed is selective to the dielectric material comprising the fourth dielectric layer 316. The etch stop layer 314 has a lower etch rate than the fourth dielectric layer 316 with regard to the etch process. As a result, the etch stop layer 314 can mitigate etch rate variations across a wafer or device, thus providing more uniform via openings 320. Additionally, the etch stop layer 314 mitigates over etching, such as over etching into the trench 312, which can degrade device performance.

The remaining thickness of the etch stop layer 314, particularly below the via openings, is related to the diffusability of conductive material from the trench 312 there through. The remaining thickness is determined by the thickness on formation, the via etch process, the composition of the etch stop layer, and the like. The above factors can be selected so as to mitigate conductive material diffusion. Additionally, parameters of the via etch, such as power, plasma density, and the like can be controlled or selected to mitigate surface charge accumulation. Some examples of suitable plasma species that can be employed include nitrogen ($N_2$), oxygen ($O_2$), carbon monoxide (CO), and the like.

Additionally, a clean process is performed prior to filling the vias 320. The clean process can be tailored to mitigate surface charge accumulation, which in turn mitigates diffusion of the conductive material from the trench. Surface charge reduction techniques, such as atmospheric deionizers, can be employed to reduce or eliminate surface charge buildup, which also mitigates void formation.

Also, rinse properties, including resistivity, of the solvent or de-ionized water employed in the clean process can be selected to mitigate surface charge accumulation. For example, $CO_2$ can be added to de-ionized water to alter resistivity to 20 k-Ohm/cm and thereby reduce accumulated surface charge. The altered resistivity of the de-ionized water can at least partially remove prior accumulated surface charge and can mitigate further accumulation of surface charge during the clean process.

The device 300, in this example, does not contain conductive voids or copper voids because one or more reduction techniques described above have been employed.

Figure 4:
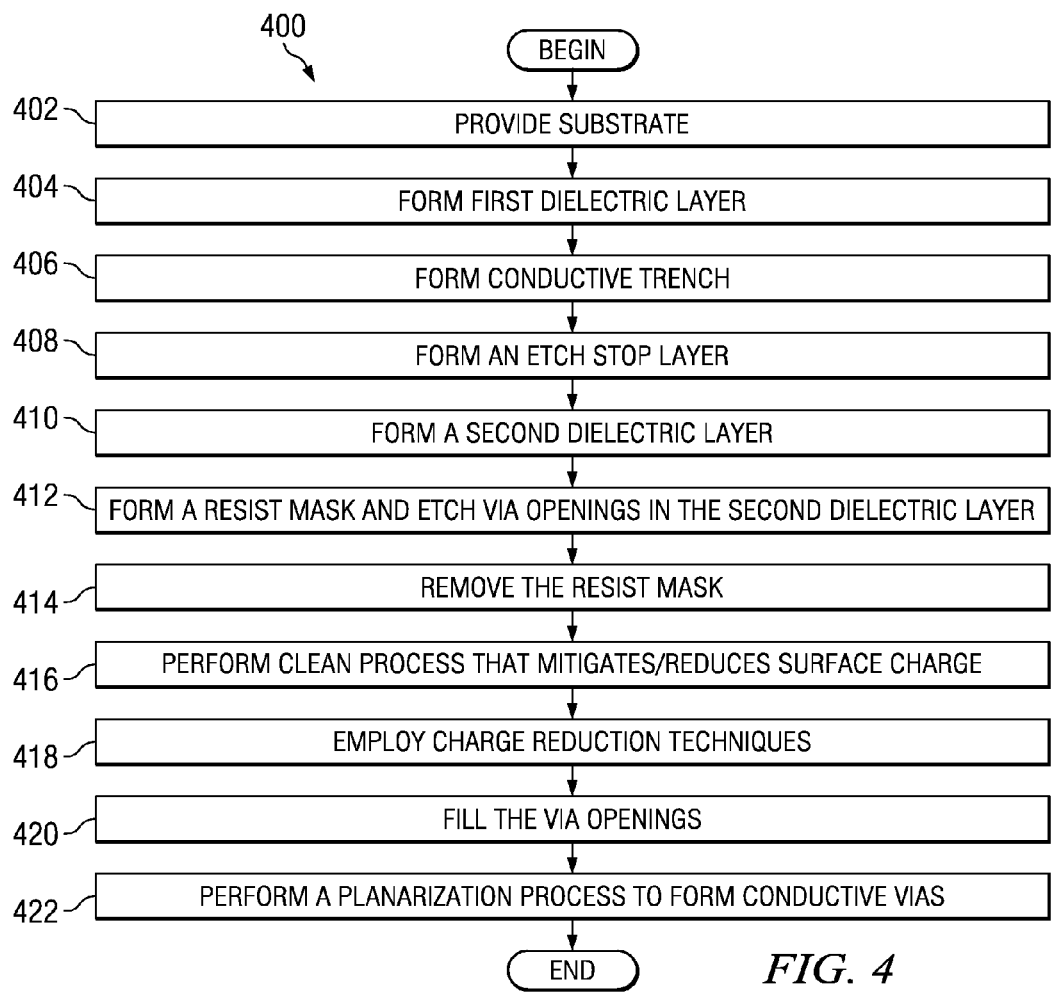
FIG. 4 is a flow diagram illustrating a method of fabricating a semiconductor device that mitigates conductive void formation or punch thru defects in accordance with an aspect of the present invention.

FIG. 4 is a flow diagram illustrating a method 400 of fabricating a semiconductor device that mitigates conductive void formation or punch thru defects in accordance with an aspect of the present invention. The above figures can be referenced for a better appreciation of the method 400 and variations thereof. The method 400 is depicted in the order shown for illustrative purposes. It is appreciated that other suitable orders of performing various portions of the method 400 are contemplated.

The method 400 begins at block 402, wherein a semiconductor substrate is provided. The substrate can include one or more semiconductor layers, active devices, passive devices, dielectric layers, and the like and is comprised of semiconductor materials, such as, silicon, germanium, and the like.

A first dielectric layer is formed over the substrate at block 404. Underlying layers can also be present below the first dielectric layer, such as, for example, metallization layers, contacts, gate structures, and the like. The first dielectric layer can be formed by a suitable process, such as a chemical vapor deposition process (CVD), plasma enhanced CVD, a spin on process, and the like. In one example, the first dielectric layer is comprised of silicon dioxide, however other dielectric materials, including low-k dielectric materials, borophosphosilicate (BPSPG) glass, TEOS, and the like. Additionally, the first dielectric layer has a suitable thickness, for example about 1000 to about 10000 Angstroms. In one example, the first dielectric layer is an inter-metal dielectric (IMD) layer.

A conductive trench is formed within the first dielectric layer at block 406. The conductive trench can be formed by patterning a trench opening within the first dielectric layer, typically via a resist mask. Then, the opening or cavity is filled with a conductive material, such as copper and a planarization process is performed to remove excess fill material. An example of a suitable fill process is an electro-chemical deposition process (ECD). Parameters of the fill process can be selected so as to mitigate grain size variations (for example, impurity level in the fill material can be modulated to control grain size) in the conductive trench, thereby mitigating hillock region formation.

Prior to filling trench opening, a barrier layer comprised of, for example, Ta, TaN, TaSiN, Ti, TiN, TiW, W and WN can be formed. The barrier layer, if present, can be formed with a suitable process, such as CVD, plasma enhanced CVD, PVD, atomic layer deposition, and the like.

Additionally, after filling the trench opening and prior to removing the excess fill material, an anneal process can be performed to mitigate hillock formation. The anneal process is performed at a selected temperature that increases grain size so as to avoid subsequent hillock formation after planarization.

After forming the trench and removing excessive filling material, a surface treatment process (typically comprised of, but not limited to, $NH_3$ plasma) is employed to improve device performance. The treatment process can be selected (e.g., the treatment time can be reduced from 15 s to 8 s, and the treatment temperature can be reduced from 400 C to 350 C or lower) so as to mitigate hillock formation.

An etch stop layer is formed over the first dielectric layer at block 408. The etch stop layer is comprised of a dielectric material that has a selected etch rate so as to facilitate subsequent etching of openings in overlying layers. Additionally, the etch stop layer 314 is typically relatively thin to facilitate device performance. Typically, the etch stop layer 314 is comprised of high-k dielectric materials.

The etch stop layer is fabricated with a composition and thickness that mitigates over etching and diffusion of conductive material from the conductive trench below.

Some examples of suitable compositions that mitigate over etching and diffusion include, for example, using dielectric materials of lower k value (SiCO) to replace the one of high k-value (SiCN), allowing the etch stop layer thickness to be increased without sacrificing device performance. This in turn reduces punch through during via etch, and also reduce electric field generated by surface charge due to increased remaining etch stop layer thickness after via etch and therefore mitigate diffusion of the conductive material from the trench As another example, a remaining thickness of greater than about 500 Angstroms can provide a suitable thickness to mitigate diffusion of conductive material there through.

A second dielectric layer is formed over the etch stop layer at block 410. The second dielectric layer can be formed by a suitable process, such as a chemical vapor deposition process (CVD), plasma enhanced CVD, a spin on process, and the like. In one example, the second dielectric layer is comprised of silicon dioxide, however other dielectric materials, including low-k dielectric materials, borophosphosilicate (BPSPG) glass, TEOS, and the like. Additionally, the second dielectric layer has a suitable thickness, for example about 1000 to about 10000 Angstroms. In one example, the second dielectric layer is an inter-level dielectric (ILD) layer.

A resist mask is formed over the device and a selective etch is performed to form via openings within the second dielectric layer at block 412. The via etch employs the etch stop layer as an etch stop in order to mitigate over etching. Additionally, the via etch is selective to the dielectric material comprising the second dielectric layer. The via etch typically removes some amount of material from the etch stop layer at the bottoms of the via openings. The amount or thickness of the etch stop layer remaining after the via etch is referred to are remaining thickness.

Uniformity of the via etch can be increased to mitigate variations in the remaining thickness and to ensure that remaining etch stop thicknesses for various via openings are within an acceptable range of values. Additionally, the remaining thickness is maintained to be greater than a selected value, such as 500 Angstroms in order to mitigate diffusion. Controlling uniformity and/or mitigating over etch can be employed to yield such a remaining etch stop thickness.

Additionally, parameters of the via etch can be selected and/or controlled so as to mitigate surface charge accumulation on the etch stop layer. For example, power, plasma density, wafer bias, plasma source bias, and the like can be selected to mitigate the surface charge accumulation during the via etch. As stated above, reduced surface charge accumulation results in reduced conductive material diffusion through the etch stop layer. Some examples of suitable plasma species that can be employed include nitrogen ($N_2$), oxygen ($O_2$), carbon monoxide (CO), and the like.

As one example, changing from $N_2$ flow to either a CO or $O_2$ based chemistry for a via etch process can reduce the punch thru defect, even with a thinner etch stop layer.

The resist mask is removed by a suitable ash process at block 414. Parameters for the ash process are selected to reduce surface charge accumulation on the etch stop layer. For example, plasma species, choice of hydrogen or oxygen, and the like, can be selected to reduce surface charge accumulation during the ash process.

A clean process is then performed at block 416 that removes remaining residue, for example, from the ash process and/or the via etch. Process parameters for the clean process are selected to mitigate accumulated surface charge and/or reduce surface charge buildup during the clean process.

In particular, solvent characteristics, such as resistivity, pH, and the like can be configured to mitigate surface charge. For example, the resistivity of de-ionized water, a solvent, can be decreased to reduce accumulated surface charge (e.g., from the via etch) and/or mitigate surface charge buildup during the clean process. Fully de-ionized water has a pH of 7.0 and has a resistivity of about 18 Meg-Ohm/cm. Adding a suitable amount of carbon dioxide can reduce the resistivity to about 20 kOhms/cm, which can reduce accumulated surface charge and/or mitigate surface charge buildup during the clean process, for this example.

It is appreciated that other suitable ionic or polar materials can be dissolved in de-ionized water to alter the resistivity of the solution. For example, water soluble salts, such as sodium chloride (NaCl) will dissolve in de-ionized water and lower its electrical resistivity. As another example, an acid or base material can be added to de-ionized water to lower its electrical resistivity. Typically, non-polar materials may dissolve in de-ionized water, thus being soluble, but not reduce the resistivity. Some examples of non-polar materials include non-polar hydrocarbons (very low solubility) and inert gases (Ar) and diatomic gases that have no net dipole moment, such as $N_2$, $O_2$, and the like.

Additionally, wafer spin-speed during the clean process can be optimized to reduce punch-thru defects, for example by increasing the wafer spin-speed from 200 rpm to 600 rpm during the solvent clean step, or adding a solvent spin-off step between the solvent clean step and the solvent rinse step in which much of the solvent is spun off the wafer versus being rinsed off the wafer.

Additionally, charge reduction techniques can be employed during or prior to the clean process at block 418. For example, atmospheric deionizers can be employed to reduce surface charge.

The via openings are filled with a conductive material at block 420. A suitable process such as an electro chemical deposition process can be employed to fill or overfill the via openings with the conductive material, such as copper. Subsequently, a planarization process, such as chemical mechanical planarization, is performed at block 422 to remove excess fill material and define the conductive vias formed in the via openings.

Additional metallization layers can then be formed by single or dual damascene processes in order to complete fabrication of the device. For these additional layers, conductive void formation can be mitigated as shown above.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Also, the term "exemplary" is intended as an example, not as a best or superior solution. Furthermore, to the extent that the term "includes" is used in either the detailed description or the claims, such term is intended to be inclusive in a manner similar to the term "comprising."

What is claimed is:

1. A method of fabricating a semiconductor device, comprising:
   forming a first conductive via in a first dielectric layer;
   forming a second dielectric layer over the first dielectric layer;
   forming a conductive trench comprised of a conductive material in the second dielectric layer;
   forming an etch stop layer over the trench, wherein the etch stop layer has a predetermined thickness;
   mitigating diffusion of the conductive material through the etch stop layer according to the predetermined thickness of the etch stop layer;
   forming a third dielectric layer over the etch stop layer;
   forming via openings in the third dielectric layer; and
   preventing void formation within the conductive trench;
   wherein forming the conductive trench comprises:
      forming a resist mask over the second dielectric layer;
      patterning trench openings within the second dielectric layer;
      removing the resist mask;
      filling the trench openings with a copper material via an electrochemical deposition process; and
      removing excess copper material by a planarization process; and
   further comprising performing the electrochemical deposition process at a temperature greater than 50° C., and increasing grain size and mitigating hillock formation in the deposited copper material in response to performing the electrochemical deposition process at a temperature greater than 50° C.

2. A method of fabricating a semiconductor device, comprising:
   forming a first conductive via in a first dielectric layer;
   forming a second dielectric layer over the first dielectric layer;
   forming a conductive trench comprised of a conductive material in the second dielectric layer;
   forming an etch stop layer over the trench, wherein the etch stop layer has a predetermined thickness;
   mitigating diffusion of the conductive material through the etch stop layer according to the predetermined thickness of the etch stop layer;
   forming a third dielectric layer over the etch stop layer;
   forming via openings in the third dielectric layer; and
   preventing void formation within the conductive trench;
   wherein forming the conductive trench comprises:
      forming a resist mask over the second dielectric layer;
      patterning trench openings within the second dielectric layer;
      removing the resist mask;
      filling the trench openings with a copper material via an electrochemical deposition process; and
      removing excess copper material by a planarization process; and
   further comprising performing an anneal at a selected temperature after filling the trench openings, and increasing grain size and mitigating hillock formation in the copper material in response to performing the anneal at the selected temperature.

3. A method of fabricating a semiconductor device, comprising:
   forming a first conductive via in a first dielectric layer;
   forming a second dielectric layer over the first dielectric layer;
   forming a conductive trench comprised of a conductive material in the second dielectric layer;
   forming an etch stop layer over the trench, wherein the etch stop layer has a predetermined thickness;
   mitigating diffusion of the conductive material through the etch stop layer according to the predetermined thickness of the etch stop layer;
   forming a third dielectric layer over the etch stop layer;
   forming via openings in the third dielectric layer; and
   preventing void formation within the conductive trench;
   wherein forming the via openings comprises selecting etch process parameters that mitigate surface charge accumulation on the etch stop layer and performing a selective etch process with the selected etch process parameters.

4. The method of claim 3, further comprising selecting a time and temperature for an ammonia treatment, performing the ammonia treatment after forming the conductive trench, and mitigating hillock formation in the copper material in response to performing the ammonia treatment.

5. The method of claim 3, wherein forming the etch stop layer comprises selecting a mitigation diffusing etch stop material that mitigates diffusion of the conductive material and depositing the selected etch stop material.

6. The method of claim 3, wherein forming the via openings comprises:
   forming a resist mask;
   patterning the third dielectric layer via the resist mask and the etch stop layer and maintaining a remaining thickness for the etch stop layer greater than a selected amount; and
   removing the resist via an ash process.

7. The method of claim 3, wherein forming the via openings comprises performing a uniform etch process to yield a remaining thickness of the etch stop layer of at least a selected value.

8. The method of claim 3, wherein the etch process parameters comprise power and plasma density.

9. The method of claim 3, further comprising performing a clean process after forming the via openings.

10. A method of fabricating a semiconductor device, comprising:
forming a first conductive via in a first dielectric layer;
forming a second dielectric layer over the first dielectric layer;
forming a conductive trench comprised of a conductive material in the second dielectric layer;
forming an etch stop layer over the trench, wherein the etch stop layer has a predetermined thickness;
mitigating diffusion of the conductive material through the etch stop layer according to the predetermined thickness of the etch stop layer;
forming a third dielectric layer over the etch stop layer;
forming via openings in the third dielectric layer; and
preventing void formation within the conductive trench;
wherein the method further comprises performing a clean process after forming the via openings; and selecting a solvent for the clean process that mitigates surface charge accumulation.

11. A method of fabricating a semiconductor device, comprising:
forming a first conductive via in a first dielectric layer;
forming a second dielectric layer over the first dielectric layer;
forming a conductive trench comprised of a conductive material in the second dielectric layer;
forming an etch stop layer over the trench, wherein the etch stop layer has a predetermined thickness;
mitigating diffusion of the conductive material through the etch stop layer according to the predetermined thickness of the etch stop layer;
forming a third dielectric layer over the etch stop layer;
forming via openings in the third dielectric layer; and
preventing void formation within the conductive trench;
wherein the method further comprises performing a clean process after forming the via openings; and selecting a solvent comprising carbon dioxide to have a selected resistivity.

12. A method of fabricating a semiconductor device, the method comprising:
providing a semiconductor substrate;
forming a first dielectric layer over the semiconductor substrate;
forming a conductive trench in the first dielectric layer;
forming an etch stop layer of a predetermined thickness over the first dielectric layer and on the conductive trench;
forming a second dielectric layer on the etch stop layer;
forming a via opening in the second dielectric layer;
performing a clean process with a solvent having a selected resistivity; and
mitigating surface charge accumulation on an upper surface of the etch stop layer according to the predetermined thickness of the etch stop layer and according to the selected resistivity of the cleaning process.

13. The method of claim 12, wherein the semiconductor substrate comprises one or more active devices.

14. The method of claim 12, further comprising forming a metallization layer on the semiconductor substrate prior to forming the first dielectric layer.

15. The method of claim 12, wherein forming the etch stop layer comprises depositing a material that mitigates diffusion of conductive material from the trench there through.

16. The method of claim 12, wherein the solvent employed in the clean process comprises de-ionized water and an amount of carbon dioxide.

17. The method of claim 16, wherein the amount of carbon dioxide is selected to mitigate surface charge accumulation on the upper surface of the etch stop layer.

18. The method of claim 16, wherein the amount of carbon dioxide is about 20 percent.

19. A method of fabricating a semiconductor device, the method comprising:
forming a conductive trench in a first dielectric layer;
selecting an etch stop thickness;
mitigating copper diffusion and over etching according to an etch stop thickness;
selecting an etch stop composition;
mitigating copper diffusion according to an etch stop composition;
forming an etch stop layer over the first dielectric layer and on the conductive trench according to the selected etch stop thickness and the selected etch stop composition;
forming a second dielectric layer on the etch stop layer;
selecting via etch process parameters
mitigating surface charge accumulation on the etch stop layer according to selected via etch process parameters; and
forming via openings in the second dielectric layer by a via etch process according to the selected via etch process parameters.

20. The method of claim 19, further comprising performing a clean process with a solvent having a selected resistivity and mitigating surface charge accumulation on the etch stop layer responsive to performing the clean process with the selected solvent.

21. The method of claim 20, further comprising filling the via openings with a conductive fill material and performing a planarization process to form conductive vias in the via openings.

22. The method of claim 21, further comprising forming a second etch stop layer over the second dielectric layer and mitigating diffusion from the conductive vias through the second etch stop layer.

23. The method of claim 22, further comprising forming a second dielectric layer over the second etch stop layer and forming trench openings within the second dielectric layer while mitigating void formation in the conductive vias.

* * * * *